(12) United States Patent
Chen et al.

(10) Patent No.: US 11,716,576 B2
(45) Date of Patent: Aug. 1, 2023

(54) DUMMY ELECTRODES FOR PERFORMANCE IMPROVEMENT OF PIEZOELECTRIC MICROELECTROMECHANICAL SYSTEM MICROPHONES

(71) Applicant: SKYWORKS SOLUTIONS, INC., Irvine, CA (US)

(72) Inventors: Guofeng Chen, Fremont, CA (US); You Qian, Singapore (SG); Rakesh Kumar, Singapore (SG); Michael Jon Wurtz, Lake Oswego, OR (US); Humberto Campanella-Pineda, Singapore (SG)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/674,203

(22) Filed: Feb. 17, 2022

(65) Prior Publication Data
US 2022/0272459 A1    Aug. 25, 2022

Related U.S. Application Data

(60) Provisional application No. 63/151,140, filed on Feb. 19, 2021.

(51) Int. Cl.
*H04R 17/02* (2006.01)
*H04R 7/08* (2006.01)
(Continued)

(52) U.S. Cl.
CPC ............... *H04R 17/02* (2013.01); *H04R 7/08* (2013.01); *H04R 7/18* (2013.01); *H10N 30/508* (2023.02); *H04R 2201/003* (2013.01)

(58) Field of Classification Search
CPC .... H04R 17/02; H04R 7/08; H04R 2201/003; H10N 30/508; H10N 30/30
See application file for complete search history.

(56) References Cited

U.S. PATENT DOCUMENTS

| 10,964,880 B2 | 3/2021 | Grosh et al. |
| 2016/0219375 A1* | 7/2016 | Hall ................... G01P 15/0922 |

(Continued)

FOREIGN PATENT DOCUMENTS

| EP | 3557881 A1 | 10/2019 |
| JP | 2008118639 A | 5/2008 |
| JP | 2019140638 A | 8/2019 |

OTHER PUBLICATIONS

Huang et al., "High Sensitivity and High S/N Microphone Achieved by PZT Film with Central-Circle Electrode Design", IEEE, 2017, pp. 1188-1191.

(Continued)

*Primary Examiner* — Tuan D Nguyen
(74) *Attorney, Agent, or Firm* — Lando & Anastasi, LLP

(57) ABSTRACT

A piezoelectric microelectromechanical system microphone comprises a piezoelectric element configured to deform and generate an electrical potential responsive to impingement of sound waves on the piezoelectric element, a sensing electrode disposed on the piezoelectric element and configured to sense the electrical potential, and a dummy electrode electrically unconnected to the sensing electrode and disposed on a portion of the piezoelectric element that is free of the sensing electrode, the dummy electrode configured to reduce static deformation of the piezoelectric element caused by residual stresses in the piezoelectric element.

25 Claims, 16 Drawing Sheets

(51) Int. Cl.
*H04R 7/18* (2006.01)
*H10N 30/50* (2023.01)

(56) References Cited

U.S. PATENT DOCUMENTS

| | | | |
|---|---|---|---|
| 2019/0281393 A1 | 9/2019 | Grosh et al. | |
| 2020/0148532 A1 | 5/2020 | Grosh et al. | |
| 2020/0351595 A1 | 11/2020 | Rusconi Clerici Beltrami et al. | |
| 2020/0382876 A1* | 12/2020 | Cerini | H04R 17/02 |
| 2021/0051413 A1 | 2/2021 | Hui et al. | |
| 2021/0084423 A1 | 3/2021 | Rusconi Clerici Beltrami et al. | |
| 2021/0120346 A1 | 4/2021 | Hui et al. | |
| 2021/0136483 A1* | 5/2021 | Hsieh | H04R 19/04 |
| 2022/0267141 A1 | 8/2022 | Chen et al. | |
| 2022/0332568 A1 | 10/2022 | Barsukou | |

OTHER PUBLICATIONS

Littrell, "High Performance Piezoelectric MEMS Microphones", A dissertation submitted in partial fulfillment of the requirements for the degree of Doctor of Philosophy (Mechanical Engineering) in the University of Michigan, 2010, 111 pages.

Williams et al., "An AlN MEMS Piezoelectric Microphone for Aeroacoustic Applications", Journal of Microelectromechanical Systems, vol. 21, No. 2, Apr. 2012, pp. 270-283.

Yan et al., "Corrugated Diaphragm for Piezoelectric Microphone", IEEE, 1996, pp. 503-506.

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.

Chen et al., "Edge-released, piezoelectric MEMS acoustic transducers in array configuration," J Micromech. Microeng. 22 (2012) 025005, pp. 1-9.

Je et al., "In situ tuning of a MEMS microphone using electrodeposited nanostructures," Journal of Micromechanics and Microengineering, 19 (2009) 035015, pp. 1-8.

Je et al., "MEMS Capacitive Microphone with Dual-Anchored Membrane", Proceedings 2017, 1, 342; Aug. 9, 2017.

Knisely et al., "Method for Controlling Stress Gradients in PVD Aluminum Nitride", Journal of Micromechanics and Microengineering, vol. 28, No. 11, 2018.

Lo et al., "Development of a No-Back-Plate SOI MEMS Condenser Microphone," IEEE, Transducers 2015, Anchorage, Alaska, Jun. 21-25, 2015, pp. 1085-1088.

Lo et al., "Sensitivity Improvement of a No-Back-Plate MEMS Microphone Using Polysilicon Trench-Refilled Process", 2017 IEEE, Transducers 2017, Kaohsiung, Taiwan, Jun. 18-22, 2017.

Mohamad et al., "Modelling and Optimisation of a Spring-Supported Diaphragm Capacitive MEMS Microphone", Engineering, 2010, 2, 762-770.

Peña-García et al., "Design and Modeling of a MEMS Dual-Backplate Capacitive Microphone with Spring-Supported Diaphragm for Mobile Device Applications," Sensors (2018), 18, 3545, 30 pages.

Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.

Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.

Shah et al., "Design Approaches of MEMS Microphones for Enhanced Performance", Hindawi, Journal of Sensors, vol. 2019, Article ID 9294528, Mar. 6, 2019, 26 pages.

Udvardi et al., Spiral-Shaped Piezoelectric MEMS Cantilever Array for Fully Implantable Hearing Systems. Micromachines (2017) 8, 311, 13 pages.

Yamashita et al., "Diaphragm deflection control of piezoelectric ultrasonic microsensors for sensitivity improvement", Sensors and Actuators A 139 (2007), pp. 118-123.

\* cited by examiner

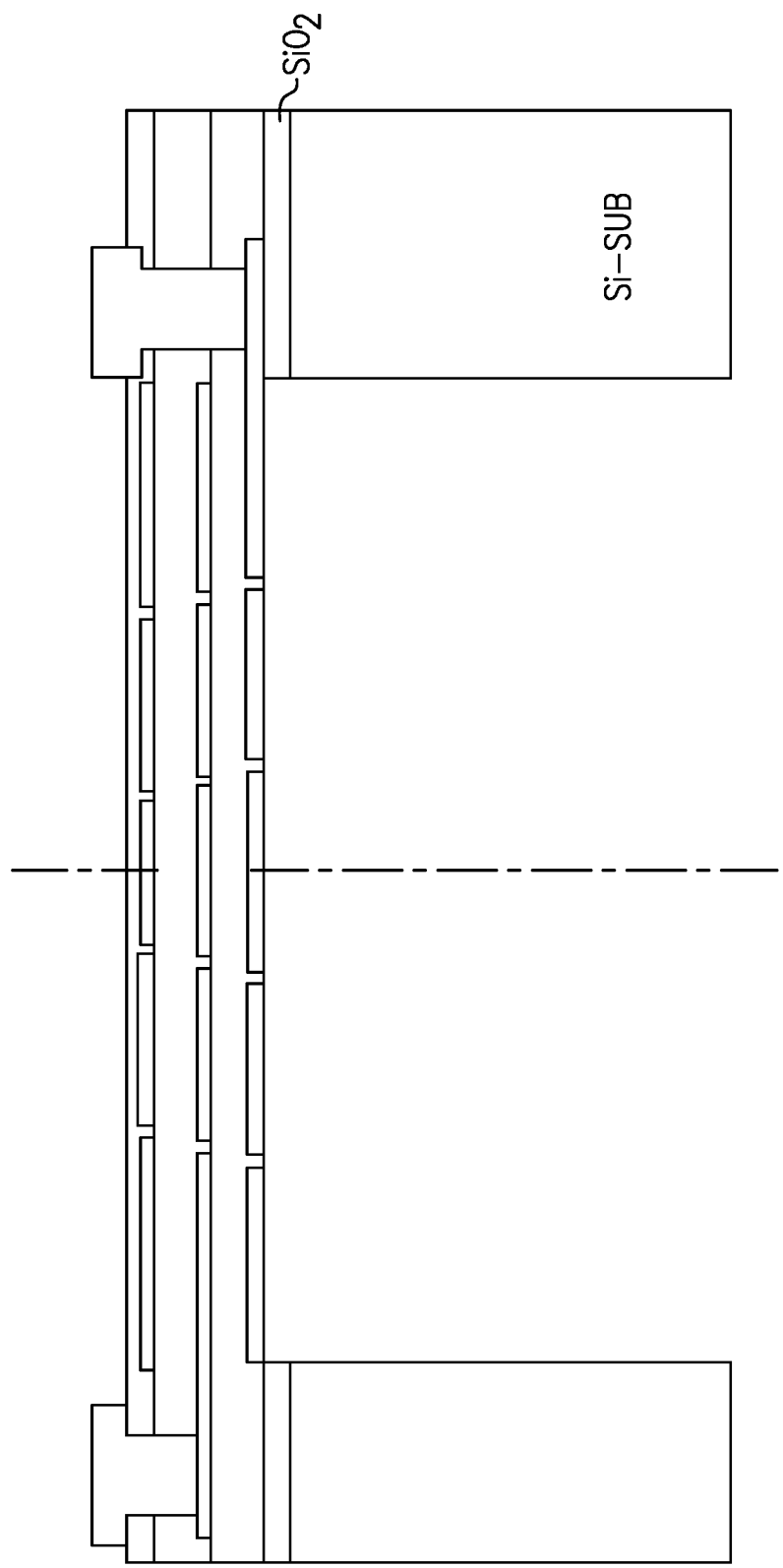

DUMMY ELECTRODES FOR PERFORMANCE IMPROVEMENT OF PIEZOELECTRIC MICROELECTROMECHANICAL SYSTEM MICROPHONES

CROSS-REFERENCE TO RELATED APPLICATIONS

This application claims priority under 35 U.S.C. § 119(e) to U.S. Provisional Patent Application Ser. No. 63/151,140, titled "DUMMY ELECTRODES FOR PERFORMANCE IMPROVEMENT OF PIEZOELECTRIC MICROELECTROMECHANICAL SYSTEM MICROPHONES," filed Feb. 19, 2021, the entire contents of which is incorporated herein by reference for all purposes.

BACKGROUND

Technical Field

Embodiments disclosed herein relate to piezoelectric microelectromechanical system microphones and to devices including same.

Description of Related Technology

A microelectromechanical system (MEMS) microphone is a micro-machined electromechanical device to convert sound pressure (e.g., voice) into an electrical signal (e.g., voltage). MEMS microphones are widely used in mobile devices such as cellular telephones, headsets, smart speakers, and other voice-interface devices/systems. Capacitive MEMS microphones and piezoelectric MEMS microphones (PMMs) are both available in the market. PMMs requires no bias voltage for operation, therefore, they provide lower power consumption than capacitive MEMS microphones. The single membrane structure of PMMs enable them to generally provide more reliable performance than capacitive MEMS microphones in harsh environments. Existing PMMs are typically based on either cantilever MEMS structures or diaphragm MEMS structures.

SUMMARY

In accordance with one aspect, there is provided a piezoelectric microelectromechanical system microphone. The piezoelectric microelectromechanical system microphone comprises a piezoelectric element configured to deform and generate an electrical potential responsive to impingement of sound waves on the piezoelectric element, a sensing electrode disposed on the piezoelectric element and configured to sense the electrical potential, and a dummy electrode electrically unconnected to the sensing electrode and disposed on a portion of the piezoelectric element that is free of the sensing electrode, the dummy electrode configured to reduce static deformation of the piezoelectric element caused by residual stresses in the piezoelectric element.

In some embodiments, the piezoelectric element has a cantilever structure having a base clamped to a supporting substrate, and a tip that is free to be displaced vertically responsive to impingement of the sound waves.

In some embodiments, the sensing electrode extends from the base of the piezoelectric element partially along a length of the piezoelectric element toward the tip.

In some embodiments, the sensing electrode includes an upper sensing electrode disposed on an upper surface of the piezoelectric element proximate the base and a lower sensing electrode disposed on a lower surface of the piezoelectric element proximate the base, and wherein the dummy electrode is disposed proximate the tip of the piezoelectric element on one or both of the upper surface or the lower surface.

In some embodiments, the piezoelectric element includes an upper film of piezoelectric material and a lower film of piezoelectric material, and a middle sensing electrode disposed between the upper film and lower film and extending from the base to a location at or proximate the tip.

In some embodiments, the piezoelectric element includes an upper film of piezoelectric material and a lower film of piezoelectric material, a middle sensing electrode disposed between the upper film and lower film proximate the base, and a middle dummy electrode disposed between the upper film and lower film proximate the tip.

In some embodiments, the upper film of piezoelectric material has a stress distribution that at least partially cancels a stress distribution in the lower film of piezoelectric material.

In some embodiments, a gap between the upper sensing electrode and an upper dummy electrode disposed on the upper surface of the piezoelectric element, a gap between the lower sensing electrode and a lower dummy electrode disposed on the lower surface of the piezoelectric element, and a gap between the middle sensing electrode and the middle dummy electrode are vertically aligned.

In some embodiments, a gap between the upper sensing electrode and an upper dummy electrode disposed on the upper surface of the piezoelectric element, a gap between the lower sensing electrode and a lower dummy electrode disposed on the lower surface of the piezoelectric element, and a gap between the middle sensing electrode and the middle dummy electrode are vertically misaligned.

In some embodiments, the gap between the upper sensing electrode and the upper dummy electrode is closer to a center of the piezoelectric microelectromechanical system microphone than the gap between the middle sensing electrode and middle dummy electrode, and the gap between the middle sensing electrode and the middle dummy electrode is closer to the center of the piezoelectric microelectromechanical system microphone than the gap between the lower sensing electrode and the lower dummy electrode.

In some embodiments, the gap between the upper sensing electrode and the upper dummy electrode is further from a center of the piezoelectric microelectromechanical system microphone than the gap between the middle sensing electrode and middle dummy electrode, and the gap between the middle sensing electrode and the middle dummy electrode is further from the center of the piezoelectric microelectromechanical system microphone than the gap between the lower sensing electrode and the lower dummy electrode.

In some embodiments, the piezoelectric element has a diaphragm structure clamped to a supporting substrate about its perimeter.

In some embodiments, the piezoelectric microelectromechanical system microphone further comprises an inner sensing electrode disposed proximate a center of the diaphragm structure, an outer sensing electrode disposed proximate the perimeter of the diaphragm structure, and a dummy electrode disposed between and separated from each of the inner electrode and the outer electrode.

In some embodiments, the inner sensing electrode includes a first upper sensing electrode disposed on an upper surface of the piezoelectric element and a first lower sensing electrode disposed on a lower surface of the piezoelectric element, and wherein the dummy electrode is disposed on one or both of the upper surface or the lower surface.

In some embodiments, the outer sensing electrode includes a second upper sensing electrode disposed on the upper surface and a second lower sensing electrode disposed on the lower surface, and the dummy electrode includes a first dummy electrode disposed on the upper surface and a second dummy electrode disposed on the lower surface.

In some embodiments, the piezoelectric element includes an upper film of piezoelectric material and a lower film of piezoelectric material, an inner middle sensing electrode disposed between the upper film and lower film proximate the center of the diaphragm structure, an outer middle sensing electrode disposed proximate the perimeter of the diaphragm structure, and a middle dummy electrode disposed between and separated from each of the inner middle sensing electrode and outer middle sensing electrode.

In some embodiments, the upper film of piezoelectric material has a stress distribution that at least partially cancels a stress distribution in the lower film of piezoelectric material.

In some embodiments, a gap between the first upper sensing electrode and an upper dummy electrode disposed on the upper surface of the piezoelectric element, a gap between the first lower sensing electrode and a lower dummy electrode disposed on the lower surface of the piezoelectric element, and a gap between the inner middle sensing electrode and the inner middle dummy electrode are vertically aligned.

In some embodiments, a gap between the first upper sensing electrode and an upper dummy electrode disposed on the upper surface of the piezoelectric element, a gap between the first lower sensing electrode and a lower dummy electrode disposed on the lower surface of the piezoelectric element, and a gap between the inner middle sensing electrode and the inner middle dummy electrode are vertically misaligned.

In some embodiments, the gap between the first upper sensing electrode and the upper dummy electrode is closer to the center of the diaphragm structure than the gap between the inner middle sensing electrode and inner middle dummy electrode, and the gap between the inner middle sensing electrode and the inner middle dummy electrode is closer to the center of the diaphragm than the gap between the first lower sensing electrode and the lower dummy electrode.

In some embodiments, the gap between the first upper sensing electrode and the upper dummy electrode is further from the center of the diaphragm structure than the gap between the inner middle sensing electrode and inner middle dummy electrode, and the gap between the inner middle sensing electrode and the inner middle dummy electrode is further from the center of the diaphragm than the gap between the first lower sensing electrode and the lower dummy electrode.

In some embodiments, a gap between the second upper sensing electrode and an upper dummy electrode disposed on the upper surface of the piezoelectric element, a gap between the second lower sensing electrode and a lower dummy electrode disposed on the lower surface of the piezoelectric element, and a gap between the inner middle sensing electrode and the inner middle dummy electrode are vertically aligned.

In some embodiments, a gap between the second upper sensing electrode and an upper dummy electrode disposed on the upper surface of the piezoelectric element, a gap between the second lower sensing electrode and a lower dummy electrode disposed on the lower surface of the piezoelectric element, and a gap between the inner middle sensing electrode and the inner middle dummy electrode are vertically misaligned.

In some embodiments, the gap between the second upper sensing electrode and the upper dummy electrode is closer to the center of the diaphragm structure than the gap between the inner middle sensing electrode and inner middle dummy electrode, and the gap between the inner middle sensing electrode and the inner middle dummy electrode is closer to the center of the diaphragm than the gap between the second lower sensing electrode and the lower dummy electrode.

In some embodiments, the gap between the second upper sensing electrode and the upper dummy electrode is further from the center of the diaphragm structure than the gap between the inner middle sensing electrode and inner middle dummy electrode, and the gap between the inner middle sensing electrode and the inner middle dummy electrode is further from the center of the diaphragm than the gap between the second lower sensing electrode and the lower dummy electrode.

In some embodiments, the dummy electrode is formed of a same material as the sensing electrode.

In some embodiments, the dummy electrode is formed of a dielectric material.

BRIEF DESCRIPTION OF THE DRAWINGS

Embodiments of this disclosure will now be described, by way of non-limiting example, with reference to the accompanying drawings.

FIG. 10 is a cross-sectional view of a modified embodiment of the diaphragm PMM of FIG. 9A;

DETAILED DESCRIPTION OF CERTAIN EMBODIMENTS

Figure 1:
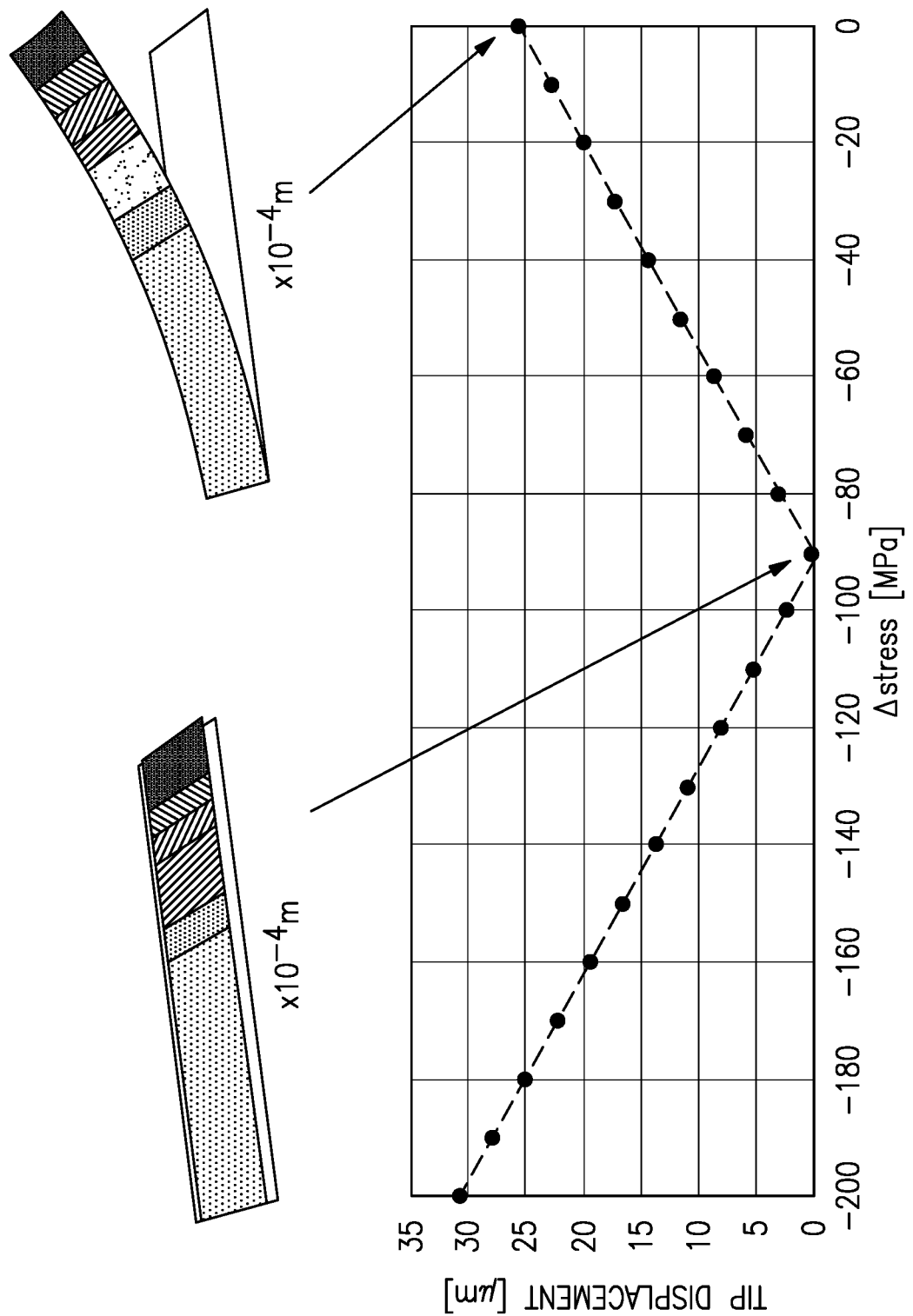
FIG. 1 is a chart of tip displacement of a cantilever element of piezoelectric microelectromechanical microphone (PMM) as a function of difference in stress between piezoelectric material layers of the cantilever element.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Microelectromechanical system (MEMS) microphones are typically produced using techniques similar to those for fabricating semiconductor devices on semiconductor wafers. The performance of MEMS microphones produced by a particular manufacturer or even within a single batch or from a single semiconductor wafer may vary due to process variations inherent in the manufacturing process for these microphones. One parameter that may differ across batches of MEMS microphones due to variations in the manufacturing process is residual stress within a piezoelectric film used as part of a sound-to-voltage transducer in the microphones. In some examples, the stress variation of a piezoelectric film, for example, a film of AlN, could be higher than 50 MPa across a single wafer due to limitations in uniformity of the AlN deposition process.

MEMS microphones having cantilever structures are generally free from sensitivity degradation due to residual stress resulting from manufacturing variation, but they suffer from poor low-frequency roll-off ($f_{-3dB}$) control as the gap between ends of opposing cantilevers enlarges when the cantilevers deflect due to the residual stress. A method to reduce cantilever static deflection is desired.

Cantilever MEMS microphone structures generate the maximum stress and piezoelectric charges near the edge of the anchor portion of the cantilever structure. Therefore, partial sensing electrodes near the anchor may be used for maximum output energy. In accordance with aspects and embodiments disclosed herein, the $-3$ dB roll-off frequency ($f_{-3dB}$) for cantilever-type PMMs may be reduced by adding dummy electrode on areas without sensing electrodes to reduce the cantilever deflection due to residual stress in the piezoelectric material of the cantilever structure.

Diaphragm-type PMMs generally do not suffer from poor low-frequency roll-off $f_{-3dB}$ control as the $f_{-3dB}$ roll-off may be controlled by a vent hole formed in the diaphragm structure that may be well defined by photolithography. However, the performance of diaphragm-type PMMs is significantly degraded with even a small amount of residual stress in the piezoelectric material forming the diaphragm as the output energy is reduced when a static deflection of the diaphragm is caused by the residual stress. A method to reduce diaphragm static deflection is desired.

Diaphragm structures generate maximum stress and piezoelectric charges in the center of the diaphragm structure and near the edge of the diaphragm anchor. Therefore, partial sensing electrodes in the diaphragm center and near the anchor may be used for maximum output energy. In aspects and embodiments disclosed herein, performance degradation of diaphragm-type PMMs may be reduced by reducing the static deflection of the diaphragm structure by adding dummy electrode on areas without sensing electrodes.

In accordance with some embodiments a PMM based on a cantilever structure that may include triangular, rectangular, or polygonal shaped cantilevers is clamped all around the edges of the PMM. The cantilever PMM includes one, two, or multiple piezoelectric layers. In embodiments including two piezoelectric layers, conductive layers are deposited on the top and the bottom of the cantilever, as well as between the two piezoelectric layers, forming a bimorph cantilever structure. Partial sensing electrodes are placed near the anchor (the base of the cantilever). The electrode size and shape are selected to output the maximum output energy ($E=0.5*C*V^2$, where C=capacitance between electrodes and V=voltage generated by the piezoelectric effect as the cantilevers are vibrated by the impact of sound waves). To reduce $-3$ dB roll-off frequency $f_{-3dB}$ (which is achieved by reducing the static deflection of cantilever PMM), the electrode-free area may also be covered by dummy electrodes. Therefore, the stress difference between areas with and without sensing electrodes is minimized to achieve lower deflection.

As discussed above, residual stresses resulting from the PMM fabrication process may play a major role in PMM performance. Thin films of piezoelectric material used in PMMs may have a uniform stress in the z direction or contain a gradient with different stresses in different portions of the film. For example, some piezoelectric material films may exhibit stress that is higher in higher z locations. Some reported AlN stress gradients are between 0.5 to 1 GPa/um. The stress gradient is used to describe stress variation in z direction. The average stress is used to describe overall stress effect of the thin film. Average stress and stress gradient cause deflection of piezoelectric thin films in PMM devices after releasing from the substrate on which the piezoelectric thin films of the devices are formed. For a PMM device containing multiple piezoelectric layers, the overall deflection can be reduced by employing a stress compensation strategy. By setting different average stress values for different piezoelectric material layers, the stresses within the overall structure can at least partially cancel out, allowing the deflection of the overall piezoelectric film structure to be reduced to minimum. However, as discussed above, cantilever and diaphragm PMM structures both may use partial sensing electrodes to achieve maximum output energy. The stress compensation strategy of setting different average stress values for different piezoelectric layers in a PMM may work well for suppressing vertical deflection of the piezoelectric cantilever or diaphragm, but horizontally there is a stress difference between areas covered with electrodes and areas not covered with electrodes, and this stress difference may cause deflection as well. Therefore, dummy electrodes may be added into areas of the piezoelectric film that are free of sensing electrodes to provide optimal stress compensation.

FIG. 1 illustrates results of a simulation of reducing deflection in a piezoelectric material cantilever by setting different average stress values for the different piezoelectric material layers in the diaphragm. A cantilever was simulated with two layers of AlN, each 300 nm thick, a length of 300 μm, and a width of 100 μm. The AlN films were assessed to have stress gradients of 1000 MPa from base to tip. The vertical displacement of the tip of the cantilever varied by changing the average stress difference (Δstress) between the two AlN layers making up the cantilever. It was found that by introducing an average stress difference of about 90 MPa between the two AlN layers making up the cantilever, the vertical displacement of the tip of the cantilever could be eliminated.

Figure 2A:
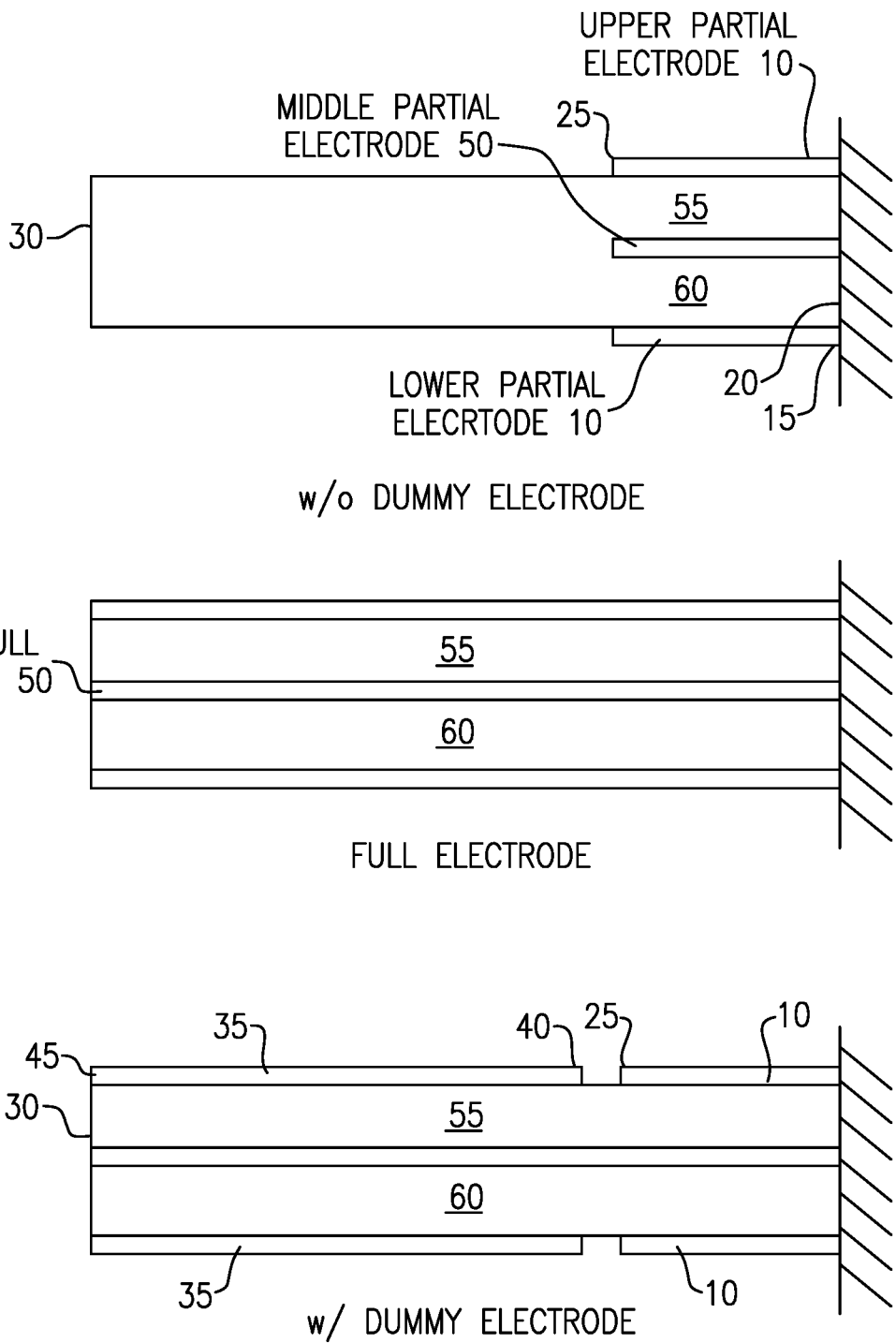
FIG. 2A illustrates different electrode configurations of a cantilever PMM.
Figure 2B:
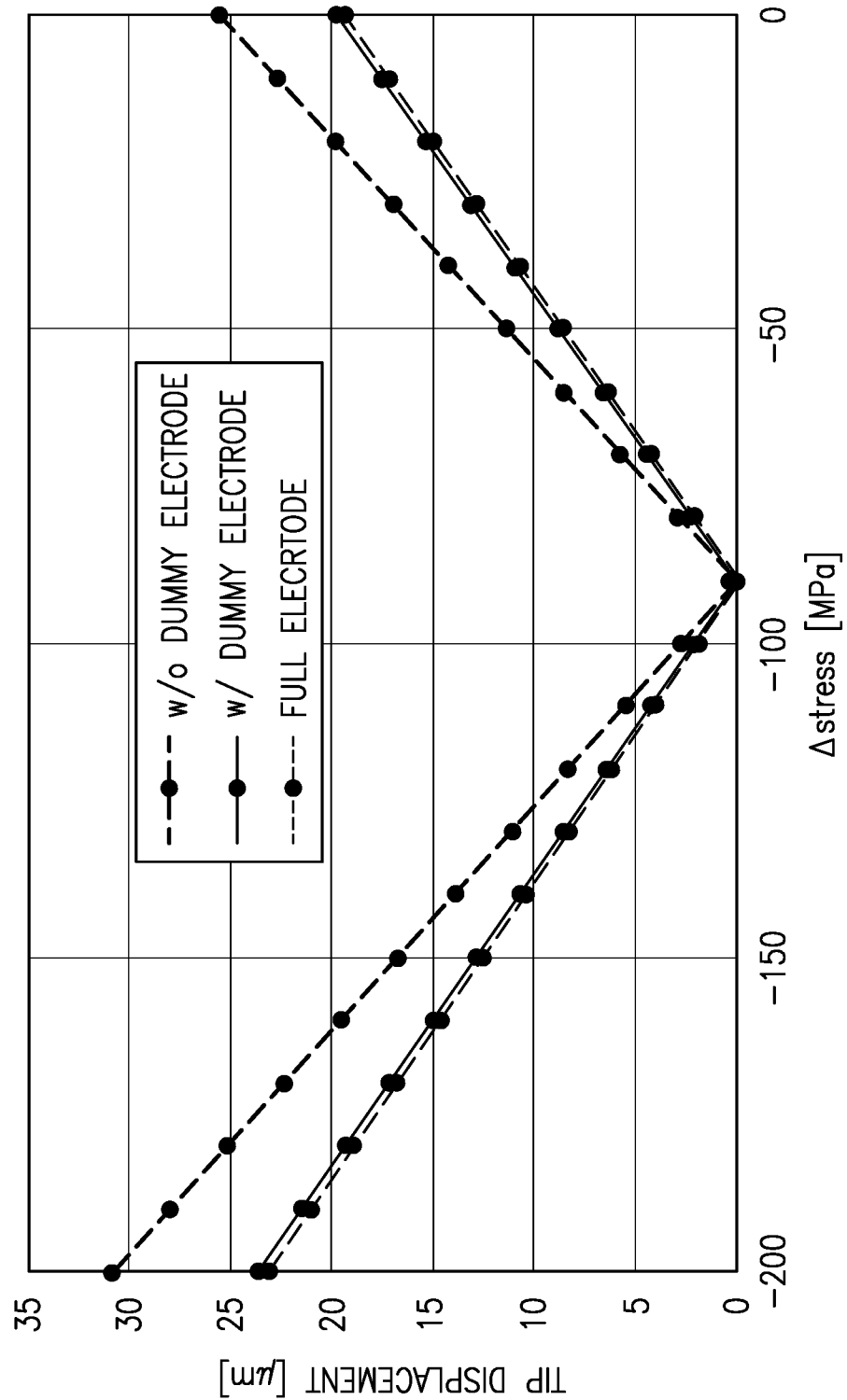
FIG. 2B is a chart of tip displacement of a cantilever element of piezoelectric microelectromechanical microphone (PMM) as a function of difference in stress between piezoelectric material layers of the cantilever element and electrode configuration.

The abovementioned stress compensation strategy could be improved to further reduce the deflection of the tip of the piezoelectric material cantilever by adding dummy electrodes to the cantilever structure. As discussed above, for increasing the energy output, and thus sensitivity of a cantilever PMM, upper and lower (or top and bottom) partial electrodes 10 may be utilized that have proximal ends 15 disposed at the base 20 of the cantilever and distal ends 25 disposed about 25% to about 35% along the length of the cantilever (the length of the cantilever may be from about 0.3 mm to about 0.5 mm in some examples) toward its tip 30, as illustrated in the "w/o dummy electrode" configuration illustrated in FIG. 2A. Dummy electrodes 35, that are spaced from the partial electrodes 10, by for example, from about 1 μm to about 3 μm, or another suitable distance that would avoid electrical contact between the partial electrodes 10 and dummy electrodes 35 may be added to the cantilever structure, as illustrated in the "w/dummy Electrode" configuration illustrated in FIG. 2A. The dummy electrodes may have proximal ends 40 closest to, but spaced from, the distal ends 25 of the partial electrodes 10 and distal ends 45 located proximate to or at the tip 30 of the cantilever structure. As illustrated in FIG. 2B, the addition of the dummy electrodes to the cantilever PMM may reduce deflection of the tip of the cantilever by about 25%, but may be insufficient to totally eliminate the deflection of the tip when the Δstress between the piezoelectric material layers of the cantilever is insufficient to totally eliminate the deflection of the tip. This reduction in deflection due to addition of the dummy electrodes is similar to what would be observed if the cantilever structure included full electrodes extending from base to the tip of the cantilever, as illustrated in the "Full Electrode" configuration in FIG. 2A. Each of the electrode configurations illustrated in FIG. 2A include a middle electrode 50 disposed between the upper 55 and lower 60 piezoelectric layers. The middle electrode 50 may be a conductive film or trace or may be a dielectric material, for example, $SiO_2$ or SiN or any other suitable dielectric material. although if made of a dielectric material, the middle electrode might not be functional to generate output energy.

Figure 3A:
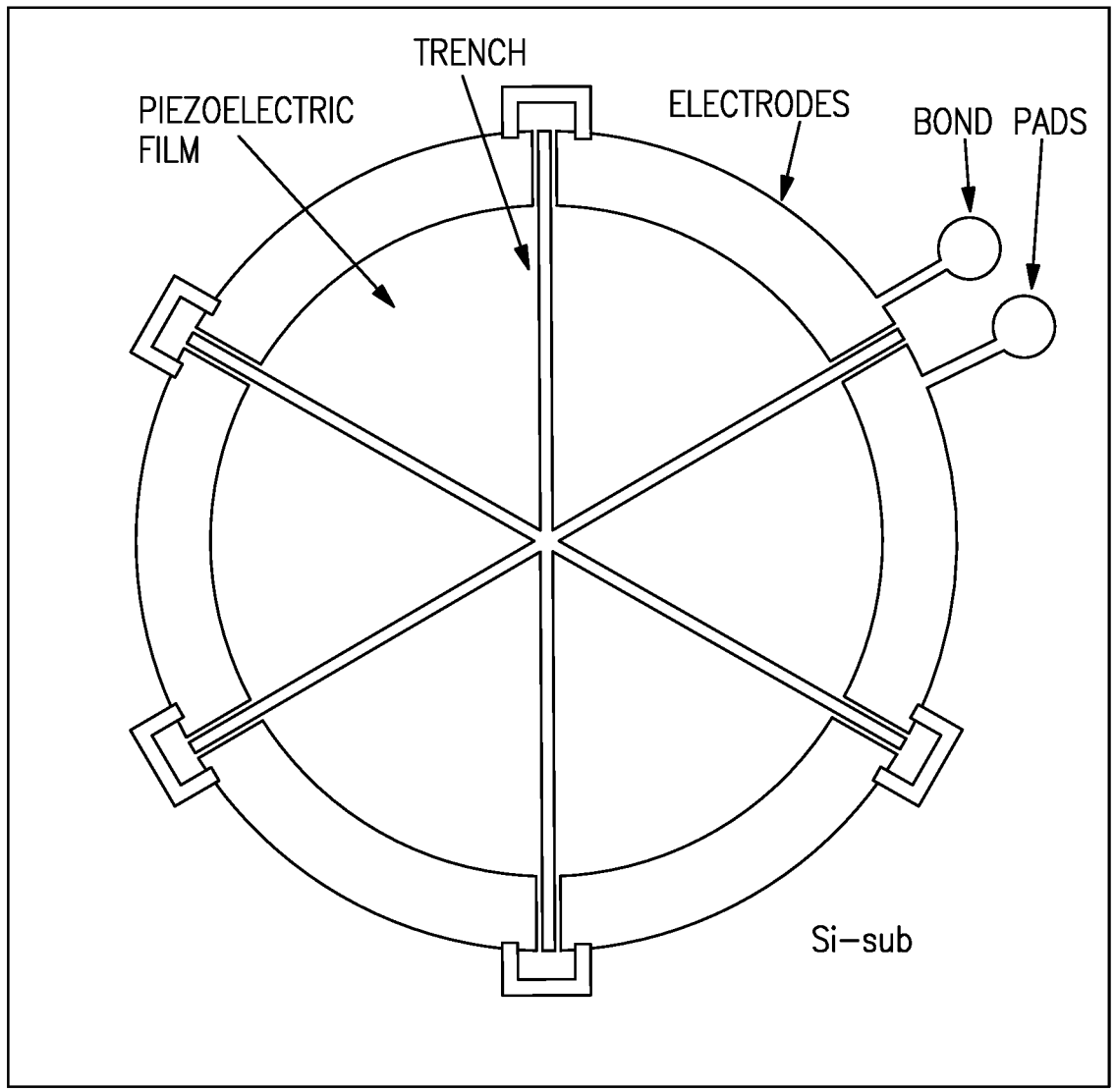
FIG. 3A is a plan view of an example of a cantilever PMM.
Figure 3B:
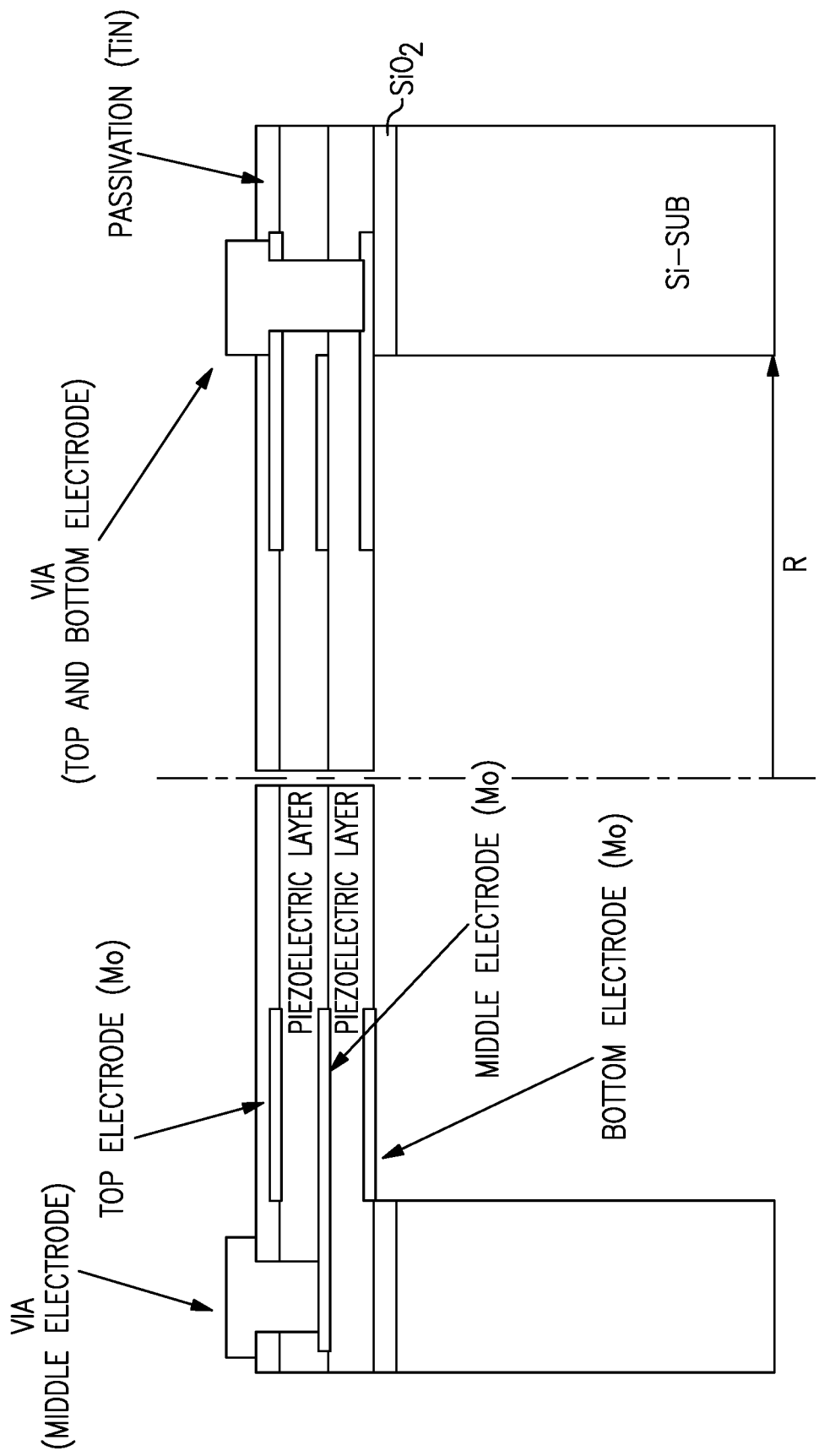
FIG. 3B is a cross-sectional view of the cantilever PMM of FIG. 3A.

One example of a cantilever PMM is illustrated in a top-down plan view in FIG. 3A and in a cross-sectional view in FIG. 3B. The cantilever PMM includes six cantilevers and top, middle, and bottom sensing/active electrodes proximate the bases of the cantilevers. The cantilevers are pie-piece shaped and together form a circular microphone structure with trenches (gaps) between adjacent cantilevers. It should be appreciated that in alternate embodiments, the cantilever structures could be shaped other than as illustrated, for example, as polygons with three or more straight or curved sides. The cantilevers have bases mounted on a substrate which could be a $SiO_2$ layer on a Si substrate. The top, bottom, and middle sensing/active electrodes in the different cantilevers are connected in series between the bond pads, except for the cantilevers having electrical connection between the electrodes and bond pads. The top and bottom electrodes of each cantilever are electrically connected to the middle electrode in an adjacent cantilever. Vias to the middle electrode of one cantilever and to the top and bottom electrodes of an adjacent cantilever are used to provide electrical connection between the bond pads and cantilever electrodes. The electrodes are indicated as being Mo, but could alternatively be Ru or any other suitable metal, alloy, or non-metallic conductive material.

The cantilever PMM microphone of FIGS. 3A and 3B may exhibit the problems discussed above where residual stresses in the piezoelectric films lead to the tips of the cantilevers deflecting from a flat plane and reducing the −3 dB roll-off frequency ($f_{-3dB}$) of the microphone. To address this problem, the cantilever PMM microphone of FIGS. 3A and 3B may be modified to include dummy electrodes as illustrated in top-down plan view in FIG. 4A and cross-sectional view in FIG. 4B. The dummy electrodes are pie-piece shaped structures covering the top and bottom (or upper and lower) surfaces of the piezoelectric film forming the cantilevers. The dummy electrodes may be formed of a conducive material, for example, a metal, and may be formed of the same material as the sensing/active electrodes. The dummy electrodes may be electrically floating. The dummy electrodes may alternatively be formed of a dielectric material, for example, $SiO_2$ or SiN. The term "dummy electrodes" as used herein may be used to refer to dummy electrode structures formed of a dielectric material. The terms "dummy structure" or "dummy electrode structure" may also be used to refer to dummy electrodes as described herein.

Figure 4A:
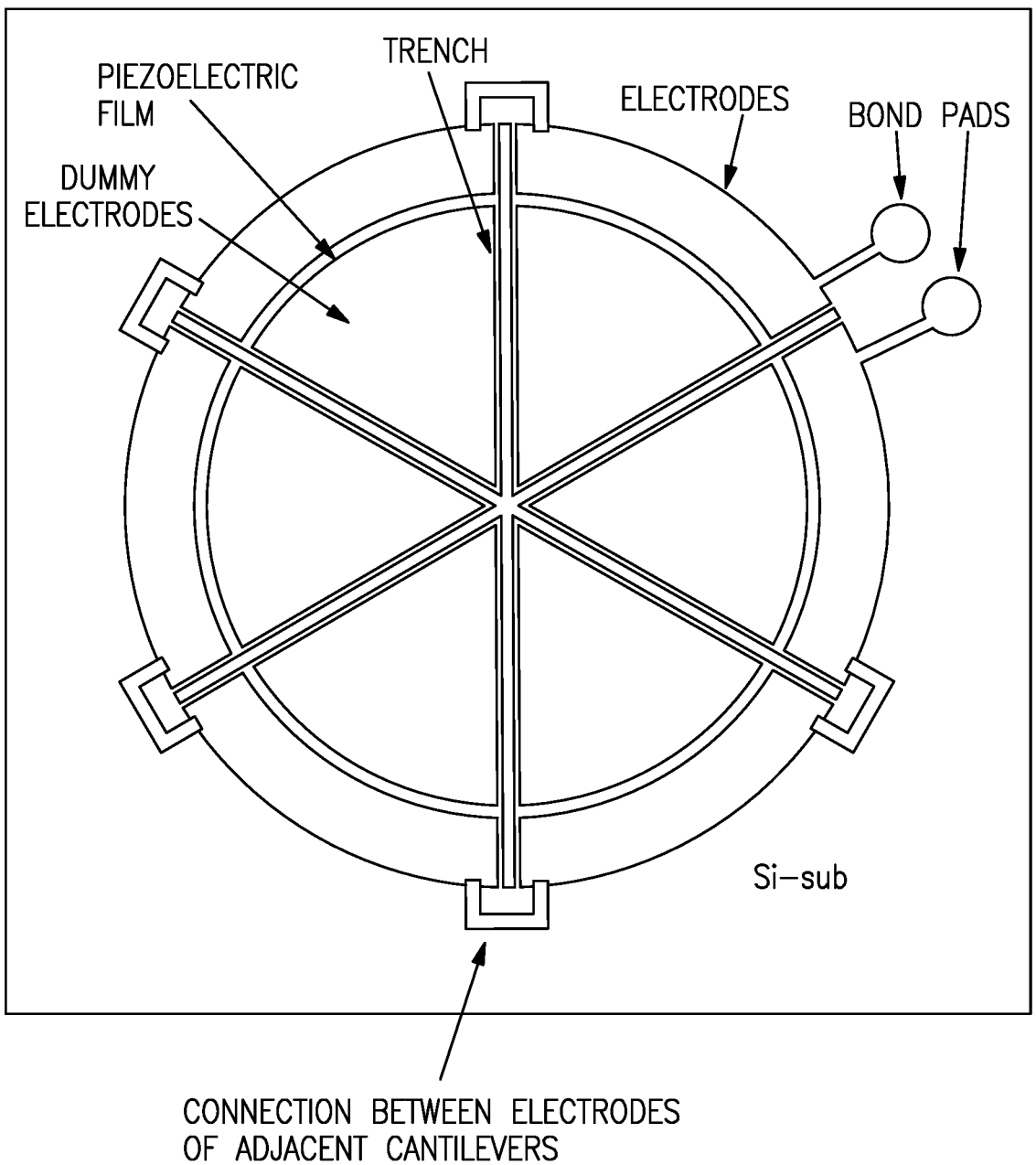
FIG. 4A is a plan view of an example of a cantilever PMM including dummy electrodes.
Figure 4B:
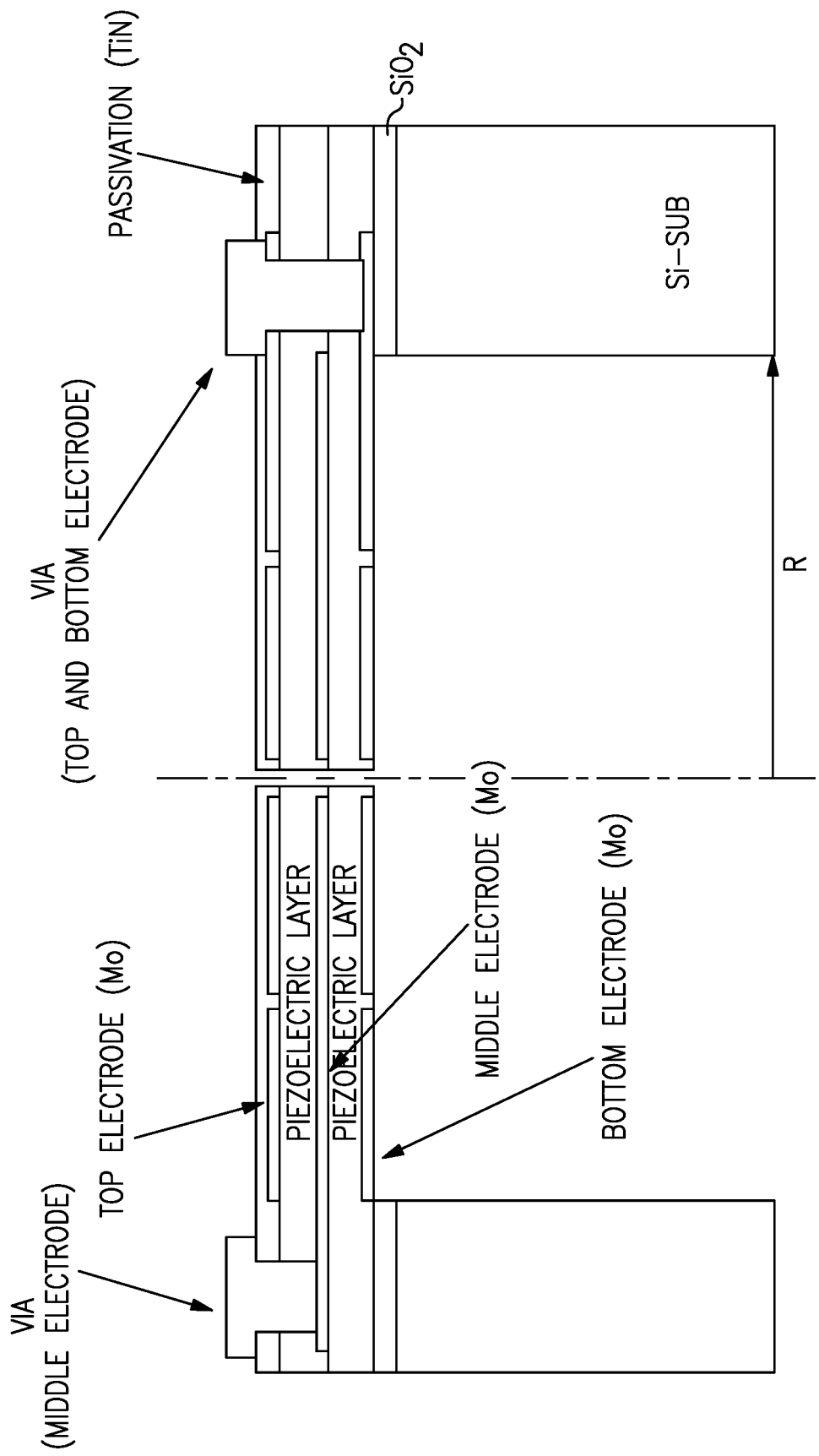
FIG. 4B is a cross-sectional view of the cantilever PMM of FIG. 4A.

The middle electrode in the embodiment of FIGS. 4A and 4B is a full electrode extending from the base of the cantilever to a point at or proximate to the tip of the cantilever. A gap is formed between the active/sensing electrodes that are in communication with the bond pads and the dummy electrodes, so the dummy electrodes are not electrically connected to the bond pads. The gaps between the active electrodes and dummy electrodes on the top and bottom surfaces of the piezoelectric film may be vertically aligned. The middle and top and bottom electrodes of the different cantilevers are electrically connected in series between the bond pads in the same manner as in the cantilever PMM of FIGS. 3A and 3B.

In a modification to the cantilever PMM of FIGS. 4A and 4B, the cantilever PMM may utilize a partial middle electrode with active electrode areas proximate the bases of the cantilevers and dummy middle electrodes circumscribed and separated by a gap (about 1 μm to about 3 μm gap width, for example) from the active middle electrodes. The gaps between the active and dummy middle electrodes may be vertically aligned with the gaps between the active and dummy top and bottom electrodes. Such a structure is illustrated in cross-sectional view in FIG. 5.

Figure 5:
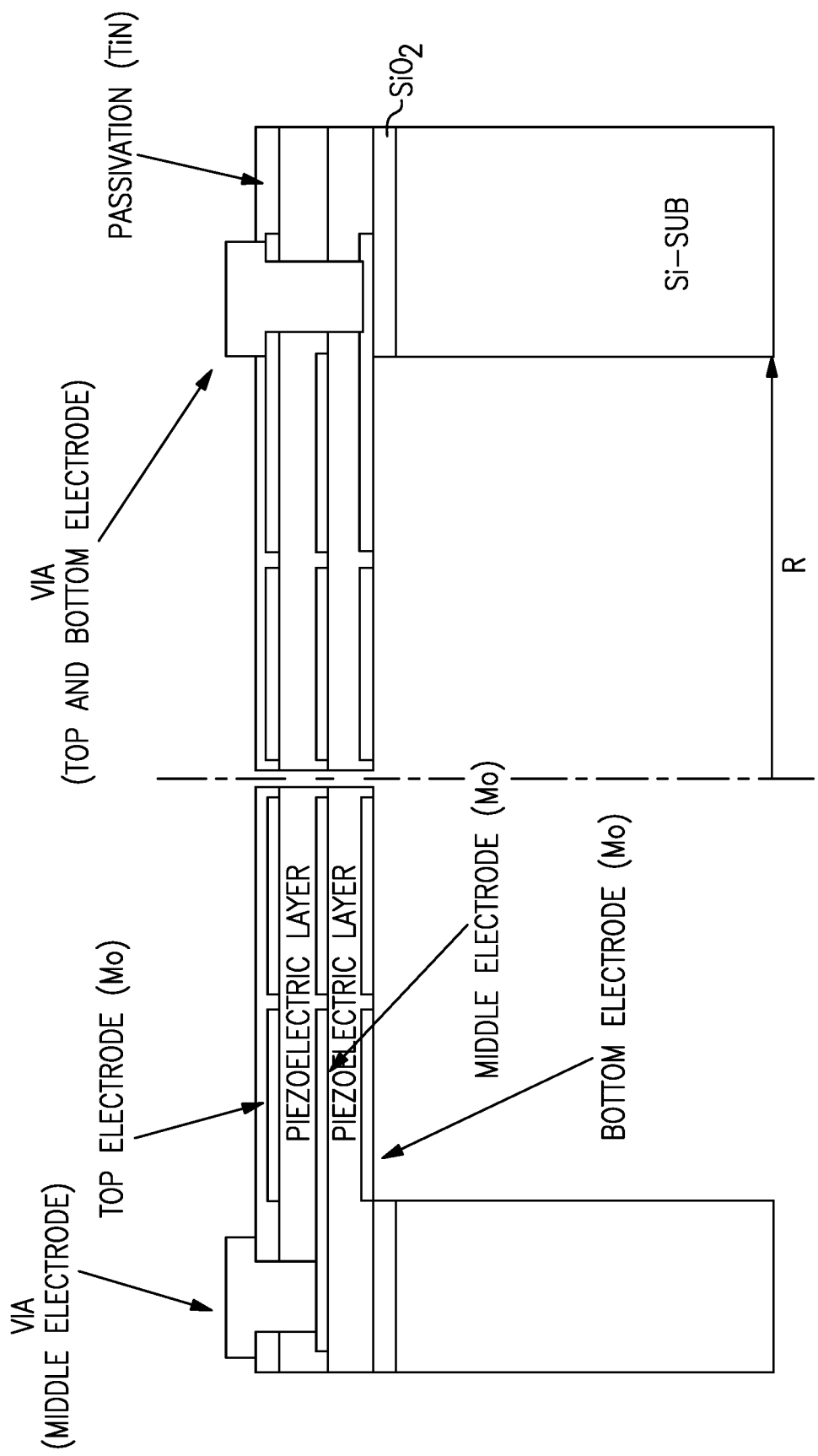
FIG. 5 is a cross-sectional view of a modified embodiment of the cantilever PMM of FIG. 4A.
Figure 6:
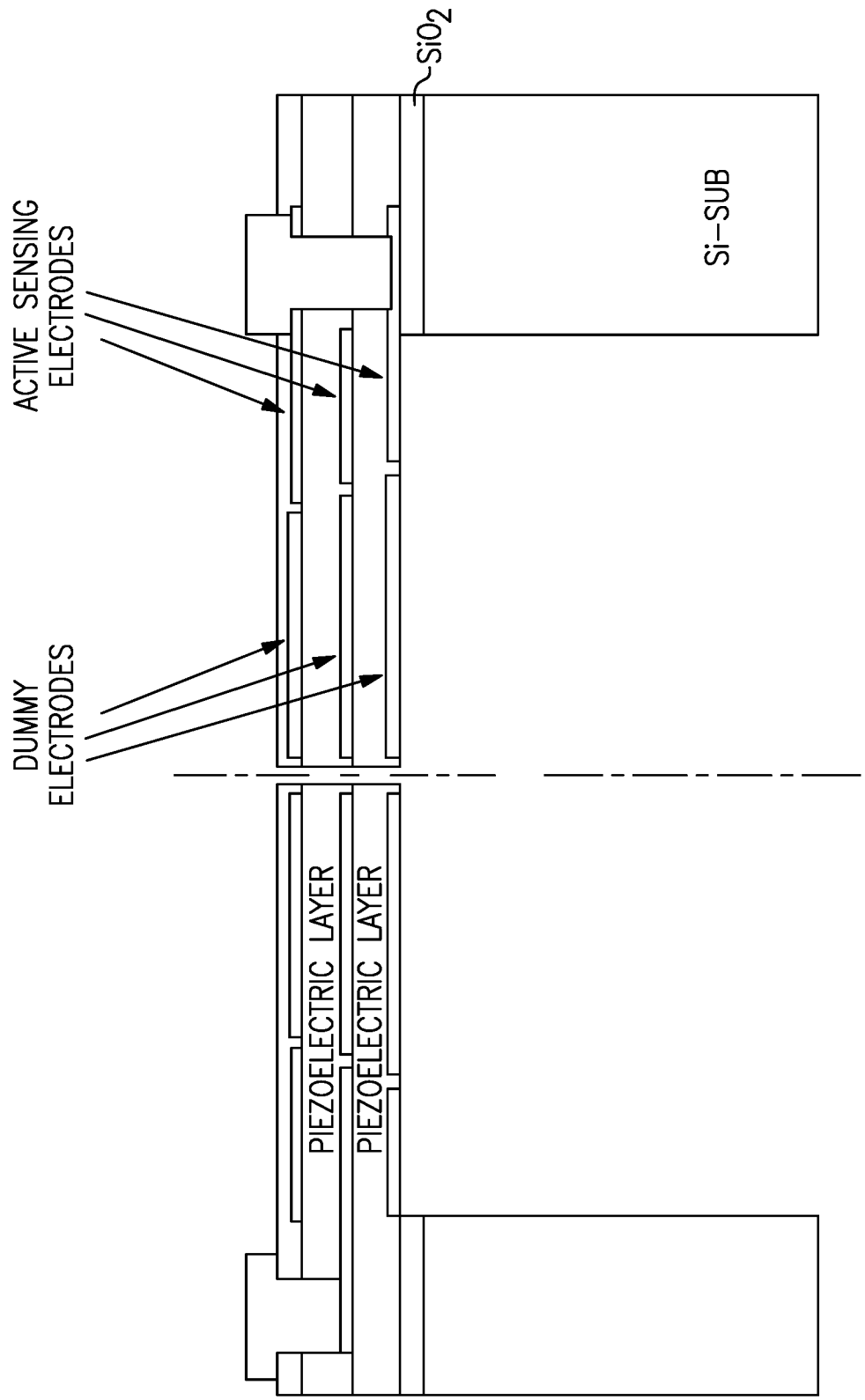
FIG. 6 is a cross-sectional view of a modified embodiment of the cantilever PMM of FIG. 5.

In a modification to the cantilever PMM of FIG. 5, the gaps between the active and dummy middle electrodes may be vertically offset from the gaps between the active and dummy top and bottom electrodes. The gaps may be offset such that the gaps are closer to the center of the PMM in the top electrodes, furthest from the center of the PMM in the bottom electrodes, and vertically disposed between the gaps between the top and bottom dummy and active electrodes for the middle active and dummy electrodes. Such a structure is illustrated in a cross-sectional view in FIG. 6. This offset of gaps may be reversed in other embodiments such that the gaps are closer to the perimeter of the PMM in the top electrodes, furthest from the perimeter of the PMM in the bottom electrodes, and vertically disposed between the gaps between the top and bottom dummy and active electrodes for the middle active and dummy electrodes. The gaps may be offset from one another by, for example, about 1 μm to about 5 μm, although this offset length is not intended to be limiting. Simulations suggest that this offsetting of gaps between top, middle, and bottom active and dummy electrodes may reduce the cantilever tip displacement by about 1% as compared to a structure such as illustrated in FIG. 5 in which the gaps between active and dummy electrodes in each layer are vertically aligned.

A second form of PMM may be based on a diaphragm structure rather than a cantilever structure. The diaphragm may be formed of a piezoelectric material that generates a voltage difference across different portions of the diaphragm when the diaphragm deforms or vibrates due to the impingement of sound waves on the diaphragm. The diaphragm may have a circular, rectangular, or polygonal shape. In some embodiments, the diaphragm structure is fully clamped all around its perimeter. Some embodiments may include diaphragm structures with different anchors such as spring anchors or corrugated anchors.

Diaphragm structures generate maximum stress and piezoelectric charges in the center and near the edge of the diaphragm anchor. The charges in the center and edge have opposite polarities. Additionally, diaphragm structures generate piezoelectric charges at the top and the bottom surfaces and the charge polarities are opposite on the top and bottom surfaces in the same area.

A diaphragm PMM may include one, two, or multiple piezoelectric material film layers in the diaphragm. In embodiments including two piezoelectric material film layers, conductive layers forming sensing/active electrodes may be deposited on the top and the bottom of the diaphragm, as well as between the two piezoelectric material film layers, forming a bimorph diaphragm structure. Partial sensing electrodes may be employed. Inner electrodes may be placed in the center of diaphragm and outer electrodes may be placed near the anchor/perimeter of the diaphragm. Sensing/active electrodes may be placed on the bottom and top, and in the middle of the vertical extent of the multi-layer piezoelectric film forming the diaphragm. The size of the sensing/active electrodes may be selected to collect the maximum output energy ($E=0.5*C*V^2$).

Output energy/sensitivity of a diaphragm PMM is reduced when the diaphragm is deflected by residual stress present in the piezoelectric material film(s) forming the diaphragm that may be a result of the manufacturing process. To reduce performance degradation from static deflection due to residual stress, the area of the diaphragm that is free of active/sensing electrodes may be at least partially covered by dummy electrodes. Therefore, the stress difference between areas with and without active/sensing electrodes may be minimized to achieve lower diaphragm deflection. The dummy electrodes may be formed of a conducive material, for example, a metal, and may be formed of the same material as the sensing/active electrodes. The dummy electrodes may be electrically floating. The dummy electrodes may alternatively be formed of a dielectric material, for example $SiO_2$ or SiN.

Figure 7:
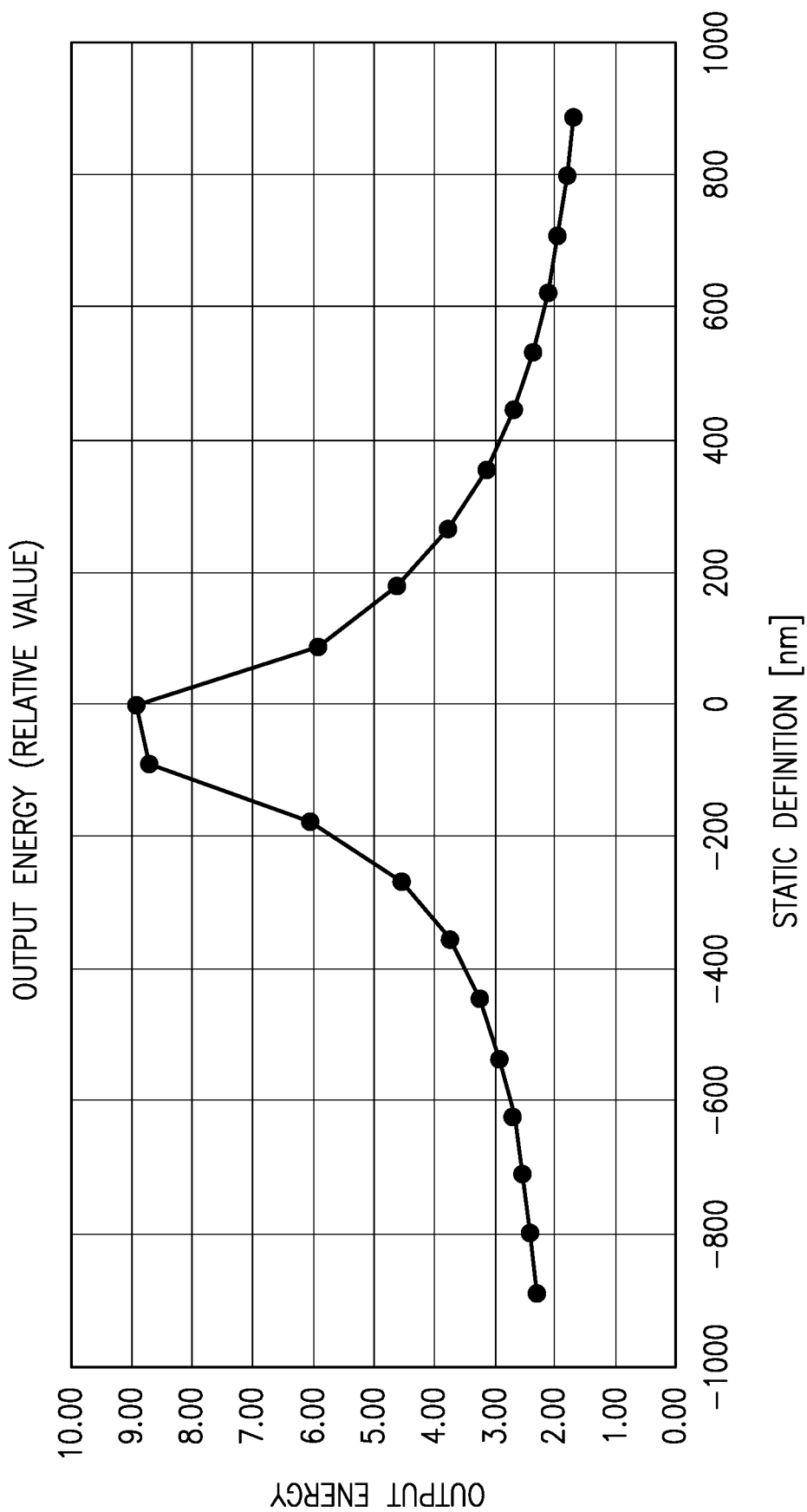
FIG. 7 is a chart of output energy versus static deflection for a diaphragm PMM.

The effect of deflection of the piezoelectric diaphragm due to residual stress in a diaphragm PMM is illustrated in FIG. 7. As can be observed from the chart of FIG. 7, output energy (in arbitrary units) may be reduced by more than two thirds from that observed in a diaphragm PMM with no static deflection when residual stresses cause static deflection of the diaphragm of more than about 400 nm in absolute value.

Figure 8A:
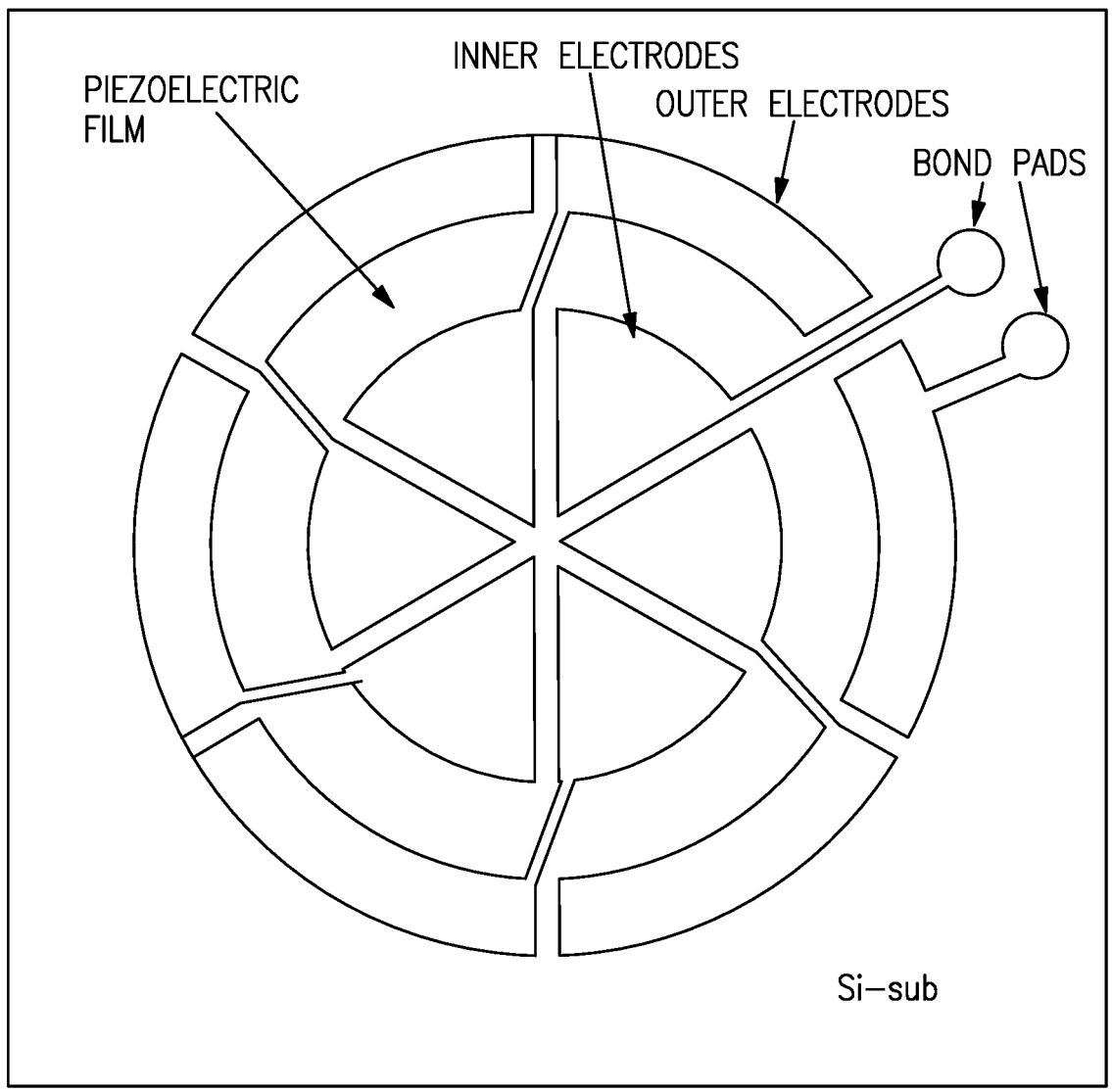
FIG. 8A is a plan view of an example of a diaphragm PMM.
Figure 8B:
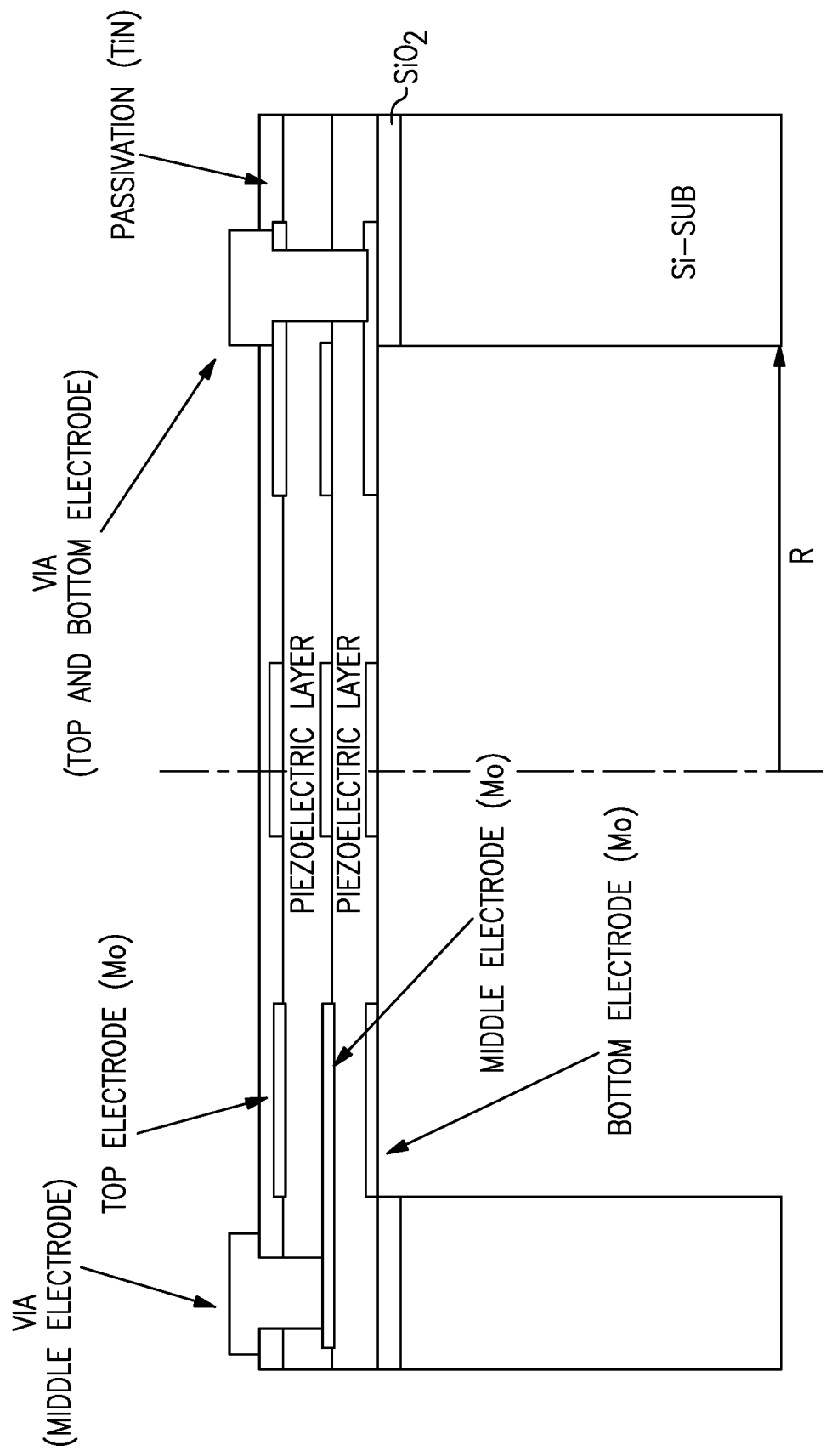
FIG. 8B is a cross-sectional view of the diaphragm PMM of FIG. 8A.

One example of a circular diaphragm PMM is illustrated in a top-down plan view in FIG. 8A and in a cross-sectional view in FIG. 8B. The circular diaphragm PMM has a circular diaphragm formed of two layers of piezoelectric material, for example, AN, that is clamped at its periphery on layers of $SiO_2$ formed on a Si substrate with a cavity defined in the substrate below the diaphragm. The circular diaphragm PMM includes a plurality of pie-piece shaped sensing/active inner electrodes disposed in the central region of the diaphragm that are segmented and separated from one another by gaps. Outer sensing/active electrodes, segmented and separated circumferentially from one another by gaps, are positioned proximate a periphery of the diaphragm and extend inward from the clamped periphery a partial of the radius of the diaphragm toward the inner electrodes. Open areas that are free of sensing/active electrodes are defined between the inner electrodes and outer electrodes. The inner electrodes and outer electrodes each include top or upper electrodes disposed on top of an upper layer of piezoelectric material of the diaphragm, bottom or lower electrodes disposed on the bottom of the lower layer of piezoelectric material of the diaphragm, and middle electrodes disposed between the upper and lower layers of piezoelectric material. The multiple inner and outer electrodes are electrically connected in series between the two bond pads. The circular diaphragm PMM of FIGS. 8A and 8B may suffer from reduced output energy/sensitivity due to static deflection of the diaphragm as a result of residual stresses remaining in the piezoelectric film layers due to the manufacturing process.

Figure 9A:
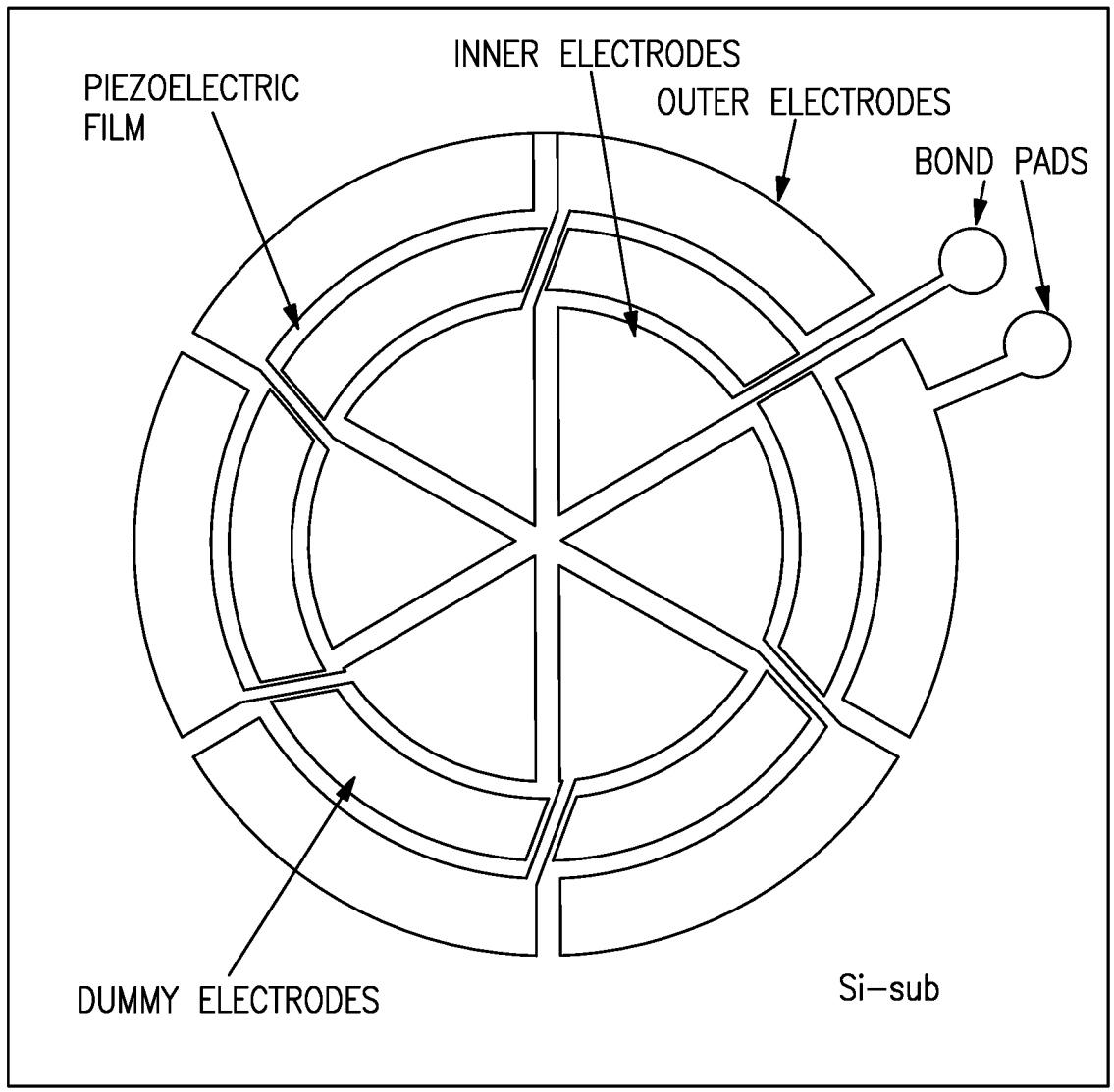
FIG. 9A is a plan view of an example of a diaphragm PMM including dummy electrodes.
Figure 9B:
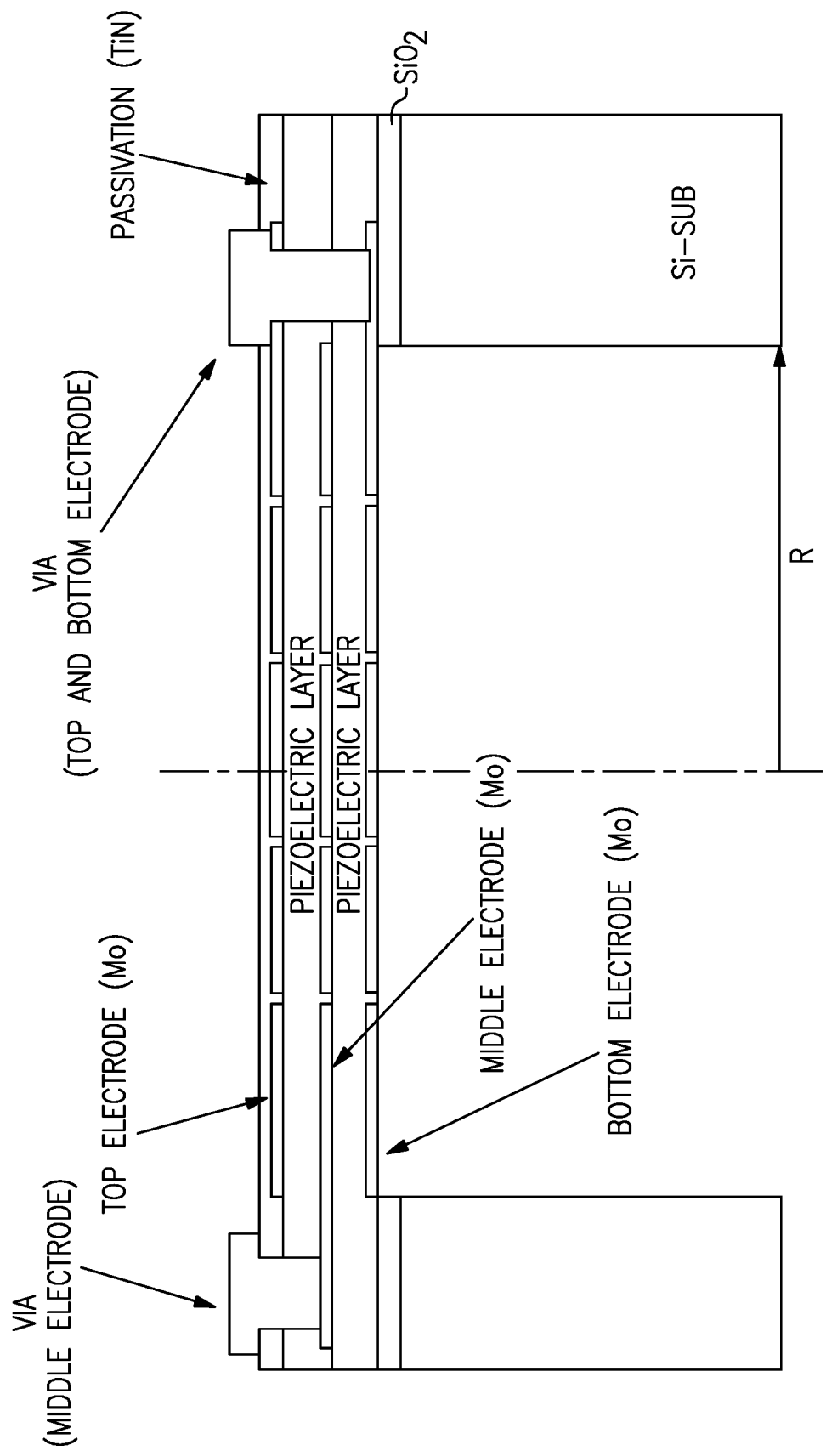
FIG. 9B is a cross-sectional view of the diaphragm PMM of FIG. 9A.

The static deflection of the diaphragm of a diaphragm PMM as illustrated in FIGS. 8A and 8B may be reduced and the output energy/sensitivity increased by adding dummy electrodes into the regions of the diaphragm between the inner and outer electrode segments. A diaphragm PMM including dummy electrodes is illustrated in a top-down plan view in FIG. 9A and a cross-sectional view in FIG. 9B. The dummy electrodes of the diaphragm PMM of FIGS. 9A and 9B are disposed between the sensing/active outer and inner electrodes on each of the top of the upper layer of piezoelectric material of the diaphragm, the bottom of the lower layer of piezoelectric material of the diaphragm, and between the upper and lower layers of piezoelectric material. The dummy electrodes are spaced from each of the sensing/active outer and inner electrodes and from conductive traces connecting the sensing/active outer and inner electrodes by gaps having gap widths of, for example, from about 1 μm to about 5 μm, although these dimensions are not intended to be limiting.

The gaps between the dummy electrodes and from each of the sensing/active outer and inner electrodes may be vertically aligned as illustrated in FIG. 9B.

The dummy electrodes are electrically unconnected from each of the sensing/active outer and inner electrodes and from the conductive traces connecting the sensing/active outer and inner electrodes and may be electrically floating. The dummy electrodes may be formed of a conducive material, for example, a metal, and may be formed of the same material as the sensing/active electrodes. The dummy electrodes may alternatively be formed of a dielectric material, for example $SiO_2$ or SiN. The dummy electrodes cause the stress difference between areas with and without active/sensing electrodes to be minimized to minimize diaphragm static deflection.

In a modification to the diaphragm PMM of FIGS. 9A and 9B and as illustrated in FIG. 10, the gaps between the active and dummy middle electrodes may be vertically offset from the gaps between the active and dummy top and bottom electrodes. The gaps may be offset such that the gaps are closer to the center of the PMM in the top electrodes, furthest from the center of the PMM in the bottom electrodes, and vertically disposed between the gaps between the top and bottom dummy and active electrodes for the middle active and dummy electrodes. This offset of gaps may be reversed in other embodiments such that the gaps are closer to the perimeter of the PMM in the top electrodes, furthest from the perimeter of the PMM in the bottom electrodes, and vertically disposed between the gaps between the top and bottom dummy and active electrodes for the middle active and dummy electrodes. The gaps may be offset from one another by, for example, about 1 µm to about 5 µm, although this offset length is not intended to be limiting.

Figure 11:
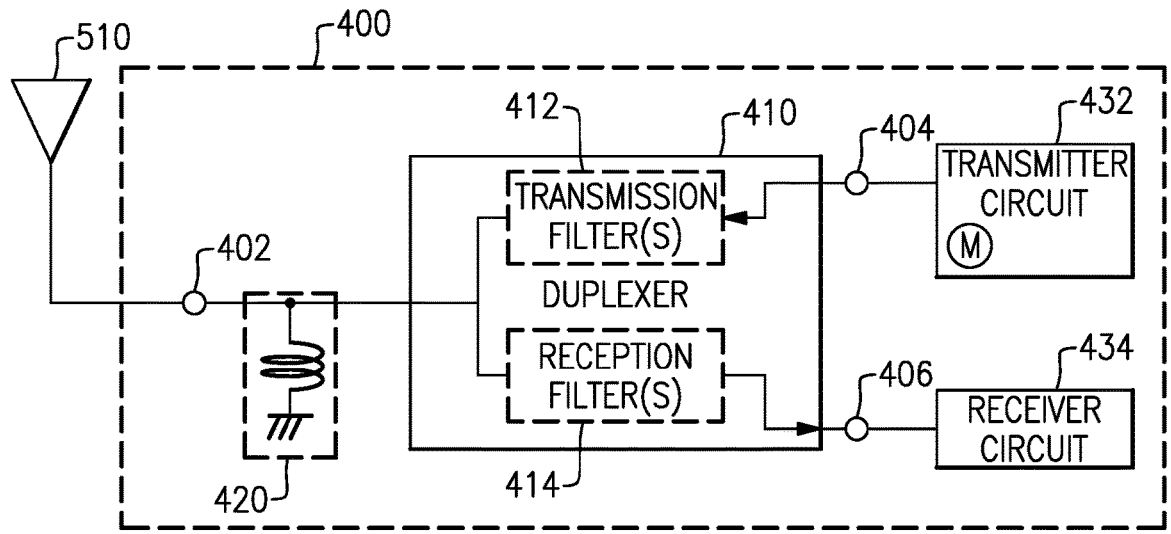
FIG. 11 is a block diagram of one example of a front-end module that can include one or more PMMs according to aspects of the present disclosure.
Figure 12:
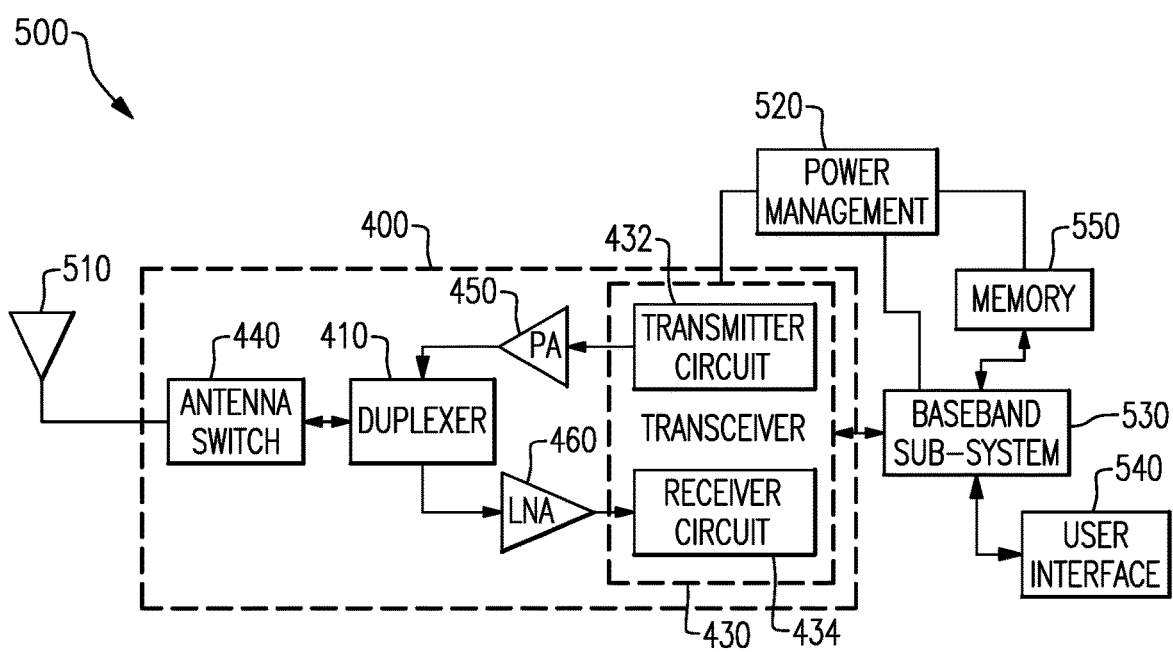
FIG. 12 is a block diagram of one example of a wireless device including the front-end module of FIG. 10.

Examples of MEMS microphones as disclosed herein can be implemented in a variety of packaged modules and devices. Some example packaged modules will now be discussed in which any suitable principles and advantages of the PMMs discussed herein can be implemented. FIGS. 11 and 12 are schematic block diagrams of illustrative packaged modules and devices according to certain embodiments.

Referring to FIG. 11, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 may include a microphone M, which may be any one or more of the embodiments of PMMs disclosed herein. The transmitter circuit 432 may generate signals for transmission via the antenna 510, and the receiver circuit 434 can receive and process signals received via the antenna 510. In some embodiments, the receiver and transmitter circuits are implemented as separate components, as shown in FIG. 11, however, in other embodiments these components may be integrated into a common transceiver circuit or module. As will be appreciated by those skilled in the art, the front-end module 400 may include other components that are not illustrated in FIG. 11 including, but not limited to, switches, electromagnetic couplers, amplifiers, processors, and the like.

FIG. 12 is a block diagram of one example of a wireless device 500 including the antenna duplexer 410 shown in FIG. 11. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 11. The front-end module 400 includes the duplexer 410, as discussed above. In the example shown in FIG. 12 the front-end module 400 further includes an antenna switch 440, which can be configured to switch between different frequency bands or modes, such as transmit and receive modes, for example. In the example illustrated in FIG. 12, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 12.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 12, the front-end module 400 may further include a low noise amplifier module 460, which amplifies received signals from the antenna 510 and provides the amplified signals to the receiver circuit 434 of the transceiver 430.

The wireless device 500 of FIG. 12 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets.

The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 10 GHz, such as in the X or Ku 5G frequency bands.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A piezoelectric microelectromechanical system microphone comprising:
   a piezoelectric element configured to deform and generate an electrical potential responsive to impingement of sound waves on the piezoelectric element;
   a sensing electrode disposed on the piezoelectric element and configured to sense the electrical potential; and
   a dummy electrode electrically unconnected to the sensing electrode and disposed on a portion of the piezoelectric element that is free of the sensing electrode, the dummy electrode configured to reduce static deformation of the piezoelectric element caused by residual stresses in the piezoelectric element.

2. The piezoelectric microelectromechanical system microphone of claim 1 wherein the piezoelectric element has a cantilever structure having a base clamped to a supporting substrate, and a tip that is free to be displaced vertically responsive to impingement of the sound waves.

3. The piezoelectric microelectromechanical system microphone of claim 2 wherein the sensing electrode extends from the base of the piezoelectric element partially along a length of the piezoelectric element toward the tip.

4. The piezoelectric microelectromechanical system microphone of claim 3 wherein the sensing electrode includes an upper sensing electrode disposed on an upper surface of the piezoelectric element proximate the base and a lower sensing electrode disposed on a lower surface of the piezoelectric element proximate the base, and wherein the dummy electrode is disposed proximate the tip of the piezoelectric element on one or both of the upper surface or the lower surface.

5. The piezoelectric microelectromechanical system microphone of claim 4 wherein the piezoelectric element includes an upper film of piezoelectric material and a lower film of piezoelectric material, and a middle sensing electrode disposed between the upper film and lower film and extending from the base to a location at or proximate the tip.

6. The piezoelectric microelectromechanical system microphone of claim 4 wherein the piezoelectric element includes an upper film of piezoelectric material and a lower film of piezoelectric material, a middle sensing electrode disposed between the upper film and lower film proximate the base, and a middle dummy electrode disposed between the upper film and lower film proximate the tip.

7. The piezoelectric microelectromechanical system microphone of claim 6 wherein the upper film of piezoelectric material has a stress distribution that at least partially cancels a stress distribution in the lower film of piezoelectric material.

8. The piezoelectric microelectromechanical system microphone of claim 6 wherein a gap between the upper sensing electrode and an upper dummy electrode disposed on the upper surface of the piezoelectric element, a gap between the lower sensing electrode and a lower dummy electrode disposed on the lower surface of the piezoelectric element, and a gap between the middle sensing electrode and the middle dummy electrode are vertically aligned.

9. The piezoelectric microelectromechanical system microphone of claim 6 wherein a gap between the upper sensing electrode and an upper dummy electrode disposed on the upper surface of the piezoelectric element, a gap between the lower sensing electrode and a lower dummy electrode disposed on the lower surface of the piezoelectric element, and a gap between the middle sensing electrode and the middle dummy electrode are vertically misaligned.

10. The piezoelectric microelectromechanical system microphone of claim 9 wherein the gap between the upper sensing electrode and the upper dummy electrode is closer to a center of the piezoelectric microelectromechanical system microphone than the gap between the middle sensing electrode and middle dummy electrode, and the gap between the middle sensing electrode and the middle dummy electrode is closer to the center of the piezoelectric microelectromechanical system microphone than the gap between the lower sensing electrode and the lower dummy electrode.

11. The piezoelectric microelectromechanical system microphone of claim 9 wherein the gap between the upper sensing electrode and the upper dummy electrode is further from a center of the piezoelectric microelectromechanical system microphone than the gap between the middle sensing electrode and middle dummy electrode, and the gap between the middle sensing electrode and the middle dummy electrode is further from the center of the piezoelectric microelectromechanical system microphone than the gap between the lower sensing electrode and the lower dummy electrode.

12. The piezoelectric microelectromechanical system microphone of claim 1 wherein the piezoelectric element has a diaphragm structure clamped to a supporting substrate about its perimeter.

13. The piezoelectric microelectromechanical system microphone of claim 12 further comprising an inner sensing electrode disposed proximate a center of the diaphragm structure, an outer sensing electrode disposed proximate the perimeter of the diaphragm structure, and a dummy electrode disposed between and separated from each of the inner electrode and the outer electrode.

14. The piezoelectric microelectromechanical system microphone of claim 13 wherein the inner sensing electrode includes a first upper sensing electrode disposed on an upper surface of the piezoelectric element and a first lower sensing electrode disposed on a lower surface of the piezoelectric element, and wherein the dummy electrode is disposed on one or both of the upper surface or the lower surface.

15. The piezoelectric microelectromechanical system microphone of claim 14 wherein the outer sensing electrode includes a second upper sensing electrode disposed on the upper surface and a second lower sensing electrode disposed on the lower surface, and the dummy electrode includes a first dummy electrode disposed on the upper surface and a second dummy electrode disposed on the lower surface.

16. The piezoelectric microelectromechanical system microphone of claim 15 wherein the piezoelectric element includes an upper film of piezoelectric material and a lower film of piezoelectric material, an inner middle sensing electrode disposed between the upper film and lower film proximate the center of the diaphragm structure, an outer middle sensing electrode disposed proximate the perimeter of the diaphragm structure, and a middle dummy electrode disposed between and separated from each of the inner middle sensing electrode and outer middle sensing electrode.

17. The piezoelectric microelectromechanical system microphone of claim 16 wherein the upper film of piezoelectric material has a stress distribution that at least partially cancels a stress distribution in the lower film of piezoelectric material.

18. The piezoelectric microelectromechanical system microphone of claim 16 wherein a gap between the first upper sensing electrode and an upper dummy electrode disposed on the upper surface of the piezoelectric element, a gap between the first lower sensing electrode and a lower dummy electrode disposed on the lower surface of the piezoelectric element, and a gap between the inner middle sensing electrode and the inner middle dummy electrode are vertically aligned.

19. The piezoelectric microelectromechanical system microphone of claim 16 wherein a gap between the first upper sensing electrode and an upper dummy electrode disposed on the upper surface of the piezoelectric element, a gap between the first lower sensing electrode and a lower dummy electrode disposed on the lower surface of the piezoelectric element, and a gap between the inner middle sensing electrode and the inner middle dummy electrode are vertically misaligned.

20. The piezoelectric microelectromechanical system microphone of claim 19 wherein the gap between the first upper sensing electrode and the upper dummy electrode is closer to the center of the diaphragm structure than the gap between the inner middle sensing electrode and inner middle dummy electrode, and the gap between the inner middle sensing electrode and the inner middle dummy electrode is closer to the center of the diaphragm than the gap between the first lower sensing electrode and the lower dummy electrode.

21. The piezoelectric microelectromechanical system microphone of claim 19 wherein the gap between the first upper sensing electrode and the upper dummy electrode is further from the center of the diaphragm structure than the gap between the inner middle sensing electrode and inner middle dummy electrode, and the gap between the inner middle sensing electrode and the inner middle dummy electrode is further from the center of the diaphragm than the gap between the first lower sensing electrode and the lower dummy electrode.

22. The piezoelectric microelectromechanical system microphone of claim 16 wherein a gap between the second upper sensing electrode and an upper dummy electrode disposed on the upper surface of the piezoelectric element, a gap between the second lower sensing electrode and a lower dummy electrode disposed on the lower surface of the piezoelectric element, and a gap between the inner middle sensing electrode and the inner middle dummy electrode are vertically aligned.

23. The piezoelectric microelectromechanical system microphone of claim 16 wherein a gap between the second upper sensing electrode and an upper dummy electrode disposed on the upper surface of the piezoelectric element, a gap between the second lower sensing electrode and a lower dummy electrode disposed on the lower surface of the piezoelectric element, and a gap between the inner middle sensing electrode and the inner middle dummy electrode are vertically misaligned.

24. The piezoelectric microelectromechanical system microphone of claim 23 wherein the gap between the second upper sensing electrode and the upper dummy electrode is closer to the center of the diaphragm structure than the gap between the inner middle sensing electrode and inner middle dummy electrode, and the gap between the inner middle sensing electrode and the inner middle dummy electrode is closer to the center of the diaphragm than the gap between the second lower sensing electrode and the lower dummy electrode.

25. The piezoelectric microelectromechanical system microphone of claim 23 wherein the gap between the second upper sensing electrode and the upper dummy electrode is further from the center of the diaphragm structure than the gap between the inner middle sensing electrode and inner middle dummy electrode, and the gap between the inner middle sensing electrode and the inner middle dummy electrode is further from the center of the diaphragm than the gap between the second lower sensing electrode and the lower dummy electrode.

\* \* \* \* \*

UNITED STATES PATENT AND TRADEMARK OFFICE
CERTIFICATE OF CORRECTION

| | | |
|---|---|---|
| PATENT NO. | : 11,716,576 B2 | Page 1 of 1 |
| APPLICATION NO. | : 17/674203 | |
| DATED | : August 1, 2023 | |
| INVENTOR(S) | : Guofeng Chen et al. | |

It is certified that error appears in the above-identified patent and that said Letters Patent is hereby corrected as shown below:

In the Specification

Column 10, Line 3, delete "AN" and insert -- A1N --

Signed and Sealed this
Twenty-ninth Day of August, 2023

Katherine Kelly Vidal
*Director of the United States Patent and Trademark Office*